(12) United States Patent
Chen et al.

(10) Patent No.: US 12,608,271 B2
(45) Date of Patent: Apr. 21, 2026

(54) MEMORY WITH ELECTRICALLY PROGRAMMABLE FUSES AND RELATED TESTER

(71) Applicant: Etron Technology, Inc., Hsinchu (TW)

(72) Inventors: Ho-Yin Chen, Hsinchu County (TW); Po-Hung Yang, Hsinchu City (TW); Chun-Chia Chen, Yunlin County (TW)

(73) Assignee: Etron Technology, Inc., Hsinchu (TW)

( * ) Notice: Subject to any disclaimer, the term of this patent is extended or adjusted under 35 U.S.C. 154(b) by 87 days.

(21) Appl. No.: 18/623,070

(22) Filed: Apr. 1, 2024

(65) Prior Publication Data

US 2024/0331797 A1 Oct. 3, 2024

Related U.S. Application Data

(60) Provisional application No. 63/455,578, filed on Mar. 30, 2023.

(51) Int. Cl.
*G11C 29/56* (2006.01)
*G06F 11/10* (2006.01)

(52) U.S. Cl.
CPC .... *G06F 11/1004* (2013.01); *G11C 29/56008* (2013.01); *G11C 29/56016* (2013.01); *G11C 2029/5602* (2013.01)

(58) Field of Classification Search
CPC .......................... G11C 29/56008; G11C 29/56
USPC .......................................................... 365/201
See application file for complete search history.

(56) References Cited

U.S. PATENT DOCUMENTS

| | | | |
|---|---|---|---|
| 12,266,415 B1 | 4/2025 | Gorman | |
| 2008/0061817 A1* | 3/2008 | Erickson | ................. G06F 30/34 |
| | | | 326/8 |
| 2020/0210586 A1* | 7/2020 | Cariello | ................. G11C 16/26 |

OTHER PUBLICATIONS

Miguel Costa et al., "Enabling ECC and Repair Features in an eFuse Box for Memory Repair Applications", 2021IEEE, 22nd International Symposium on Quality Electronic Design (ISQED), 2021.*

* cited by examiner

*Primary Examiner* — Muna A Techane
(74) *Attorney, Agent, or Firm* — Winston Hsu

(57) ABSTRACT

A memory with e-fuses includes a receiving circuit and a plurality of e-fuse groups. Each e-fuse group of the e-fuse groups is coupled to the receiving circuit through a corresponding bus group. The receiving circuit receives a plurality of blown signal sets each time and transmits each of the blown signal sets to a e-fuse group, and predetermined e-fuses of the e-fuse group are blown according to the each of the blown signal sets to adjust predetermined settings of the memory, and the each of the blown signal sets only corresponds to the e-fuse group. A number of the plurality of blown signal sets is not greater than a number of the e-fuse groups.

17 Claims, 4 Drawing Sheets

| G11 | 2 |
|-----|----|
| G12 | 4 |
| G13 | 10 |
| G21 | 3 |
| G22 | 5 |
| G31 | 5 |

FIG. 3

MEMORY WITH ELECTRICALLY PROGRAMMABLE FUSES AND RELATED TESTER

CROSS REFERENCE TO RELATED APPLICATIONS

This application claims the benefit of U.S. Provisional Application No. 63/455,578, filed on Mar. 30, 2023. The content of the application is incorporated herein by reference.

BACKGROUND OF THE INVENTION

1. Field of the Invention

The present invention relates to a memory and a related tester, and particularly to a memory with electrically programmable fuses (e-fuses) and a related tester that can blow the e-fuses of the memory.

2. Description of the Prior Art

E-fuses of a memory can be used for adjusting predetermined settings of the memory. Specifically, after the memory is tested by a tester, the tester may need blow partial (or all) e-fuses included in each e-fuse unit of at least one e-fuse unit of the memory according to a test result. In the prior art, the tester can blow the partial (or all) e-fuses included in the each e-fuse unit in turn. However, suppose the tester needs to blow 10 e-fuses included in 10 e-fuse units, wherein each of the 10 e-fuse units only includes 1 e-fuse. Then, even if the tester may have an e-fuse blowing ability of blowing 10 e-fuses each time, it still takes the tester 10 times to blow the 10 e-fuses included in the 10 e-fuse units in turn. Therefore, the e-fuse blowing ability may not be fully utilized each time, and an e-fuse blowing efficiency is reduced. Therefore, how to improve the e-fuse blowing efficiency becomes an important issue for a memory designer.

SUMMARY OF THE INVENTION

An embodiment of the present invention provides a memory with e-fuses. The memory includes a receiving circuit and L e-fuse groups. Each of the e-fuse groups is coupled to the receiving circuit through a corresponding bus group. The receiving circuit receives a plurality of blown signal sets each time and transmits each of the blown signal sets to a e-fuse group, and predetermined e-fuses of the e-fuse group are blown according to the each of the blown signal sets to adjust predetermined settings of the memory, and the each of the blown signal sets only corresponds to the e-fuse group. A number of the plurality of blown signal sets is not greater than a number of the e-fuse groups.

According to one aspect of the invention, the receiving circuit includes a plurality of register groups, wherein a register group of the register groups transmits the each of the blown signal sets to the e-fuse group.

According to one aspect of the invention, the receiving circuit includes a decoding circuit, wherein the decoding circuit decodes a code comprised in the each of the blown signal sets to make the each of the blown signal sets be transmitted to the e-fuse group.

According to one aspect of the invention, the receiving circuit includes a plurality of decoding circuits, wherein a corresponding decoding circuit of the decoding circuits decodes a code comprised in the each of the blown signal sets to make the each of the blown signal sets be transmitted to the e-fuse group.

According to one aspect of the invention, the blown signal sets are generated from a tester.

According to one aspect of the invention, when the blown signal sets are transmitted to partial e-fuse groups of the e-fuse groups, a number of the partial e-fuse groups is not greater than the number of the e-fuse groups, a number of blown e-fuses of the partial e-fuse groups is not greater than a maximum, the maximum is determined by the tester, and the blown e-fuses correspond to the blown signal sets.

According to one aspect of the invention, the maximum is determined by maximum current provided by the tester and current consumption corresponding to an e-fuse of the blown e-fuses.

According to one aspect of the invention, the receiving circuit receives the blown signal sets from the tester through corresponding input/output pads of the memory.

According to one aspect of the invention, the predetermined settings correspond to at least one of activations of partial memory cells of the memory, internal operation voltages of the memory, and operational timings of the memory.

According to one aspect of the invention, a number of the predetermined e-fuses of the e-fuse group is not greater than a number of all e-fuses of the e-fuse group.

Another embodiment of the present invention provides a memory with e-fuses. The memory includes a plurality of e-fuse groups, wherein each of partial e-fuse groups of the e-fuse groups receives a corresponding blown signal set to blow predetermined e-fuses of the each of the partial e-fuse groups to adjust predetermined settings of the memory, a number of the partial e-fuse groups is not greater than a number of the e-fuse groups.

According to one aspect of the invention, a plurality of blown signal sets received by the e-fuse groups are generated from a tester.

According to one aspect of the invention, a number of blown e-fuses of the partial e-fuse groups is not greater than a maximum, the maximum is determined by the tester, and the blown e-fuses correspond to the blown signal sets.

According to one aspect of the invention, the maximum is determined by maximum current provided by the tester and current consumption corresponding to an e-fuse of the blown e-fuses.

According to one aspect of the invention, the predetermined settings correspond to at least one of activations of partial memory cells of the memory, internal operation voltages of the memory, and operational timings of the memory.

According to one aspect of the invention, a number of the predetermined e-fuses of the each of the partial e-fuse groups is not greater than a number of all e-fuses of the each of the partial e-fuse groups.

Another embodiment of the present invention provides a tester applied to a memory with e-fuses, wherein the memory comprises L e-fuse groups, the tester generating a plurality of blown signal sets each time to the memory, wherein each blown signal set of the a plurality of blown signal sets has a code which makes the each blown signal set be transmitted to a corresponding e-fuse group of the L e-fuse groups, predetermined e-fuses of the corresponding e-fuse group are blown according to the each blown signal set to adjust predetermined settings of the memory, L is an integer greater than 1, and a number of the at least one blown signal set is not greater than L.

The present invention provides a memory with e-fuses and a tester applied to the memory, wherein the memory includes a receiving circuit, a plurality of bus groups, and a plurality of e-fuse groups. The tester determines a blowing sequence for blowing a part or all of the e-fuses of the memory to adjust predetermined settings of the memory. Then, the tester generates corresponding blown signal sets according to the blowing sequence each time, and transmits the corresponding blown signal sets to the receiving circuit. The receiving circuit transmits each blown signal set of the corresponding blown signal sets to a corresponding e-fuse group through a corresponding bus group to blow predetermined e-fuses of the corresponding e-fuse group. Therefore, compared to the prior art, the present invention can increase the utilization of the e-fuse blowing ability of the tester, reduce the time consuming of blowing the part or the all of the e-fuses of the memory, and increase the efficiency of blowing the part or the all of the e-fuses of the memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating an example of the part or the all of the e-fuses of the memory.

DETAILED DESCRIPTION

Figure 1:
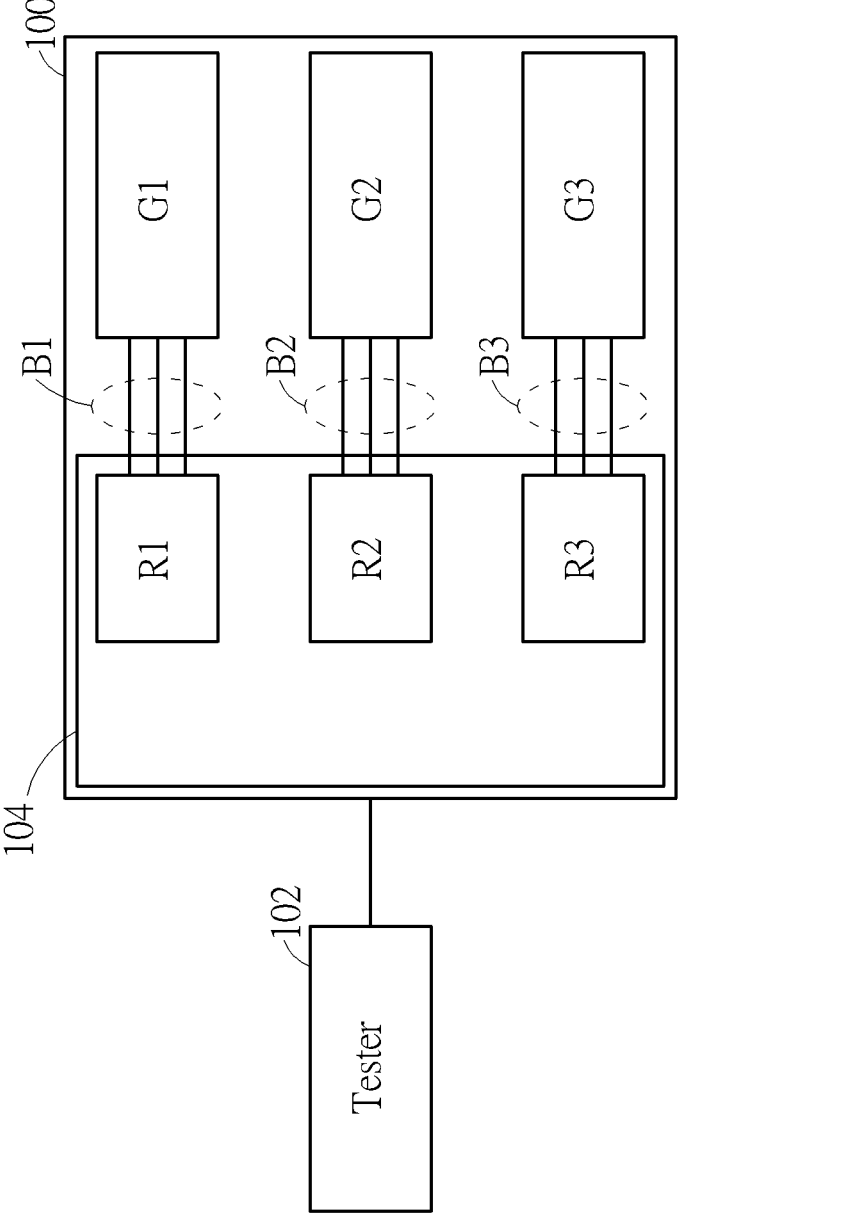
FIG. 1 is a diagram illustrating a memory with electrically programmable fuses according to a first embodiment of the present invention.

Please refer to FIG. 1. FIG. 1 is a diagram illustrating a memory 100 with electrically programmable fuses (e-fuses) according to a first embodiment of the present invention, wherein the memory 100 is coupled to a tester 102, and the tester 102 is used for testing the memory 100 and blowing e-fuses of the memory 100. The memory 100 includes a receiving circuit 104, bus groups B1-B3, and e-fuse groups G1-G3, wherein the receiving circuit 104 includes register groups R1-R3. The e-fuse group G1 is coupled to the register group R1 through the bus group B1; the e-fuse group G2 is coupled to the register group R2 through the bus group B2; the e-fuse group G3 is coupled to the register group R3 through the bus group B3. However, the present invention is not limited to the memory 100 including the e-fuse groups G1-G3 as shown in FIG. 1. That is, the memory 100 can include a plurality of e-fuse groups. Meanwhile, the memory 100 also includes a plurality of bus groups corresponding to the plurality of e-fuse groups, and the receiving circuit 104 can also include a plurality of register groups corresponding to the plurality of e-fuse groups.

Figure 2:
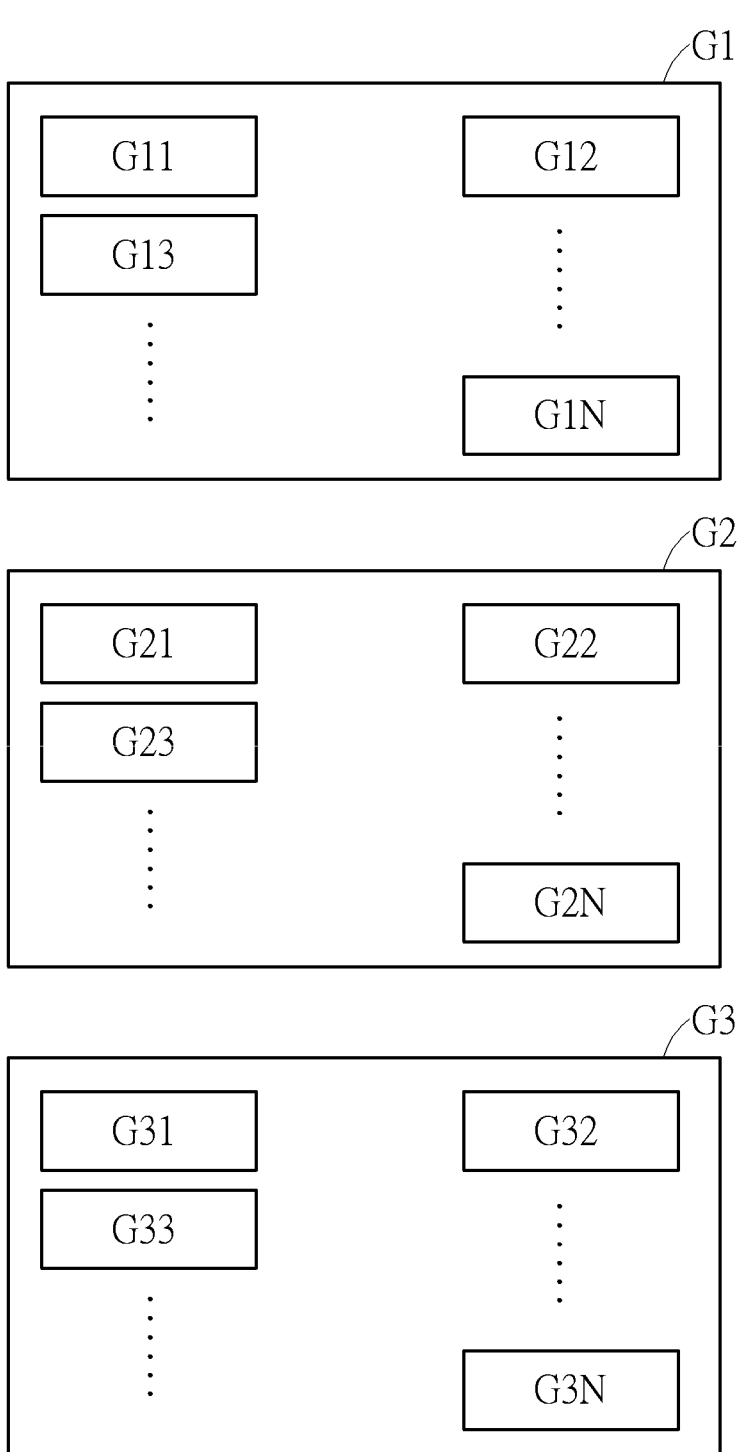
FIG. 2 is a diagram illustrating the e-fuse groups.

Please refer to FIG. 2. FIG. 2 is a diagram illustrating the e-fuse groups G1-G3. As shown in FIG. 2, the e-fuse group G1 includes e-fuse units G11, G12, G13 . . . . GIN, wherein each e-fuse unit of the e-fuse units G11, G12, G13 . . . . GIN includes a plurality of e-fuses, wherein N is a positive integer. Similarly, the e-fuse group G2 includes e-fuse units G21, G22, G23 . . . . G2N, the e-fuse group G3 includes e-fuse units G31, G32, G33 . . . . G3N, and each e-fuse unit of the e-fuse units G21, G22, G23 . . . . G2N, G31, G32, G33 . . . . G3N also includes a plurality of e-fuses. However, the present invention is not limited to each e-fuse group of the e-fuse groups G1, G2, G3 including Ne-fuse units. That is, numbers of e-fuse units included in the e-fuse groups G1, G2, G3 can be different from each other.

The tester 102 is used for testing the memory 100, wherein operation of the tester 102 testing the memory 100 is well-known to those of ordinary skill in the art, so further description thereof is omitted for simplicity. In addition, testing items of the tester 102 corresponding to the memory 100 is determined by a requirement of a designer of the memory 100. After the tester 102 finishes testing the memory 100, the tester 102 may need to blow a part or all of the e-fuses of the memory 100 to adjust predetermined settings of the memory 100, wherein the predetermined settings can correspond to at least one of activations of partial memory cells of the memory 100, internal operation voltages of the memory 100, and operational timings of the memory 100. But, the present invention is not limited to the predetermined settings including the at least one of activations of the partial memory cells, the internal operation voltages, and the operational timings. That is, blowing the part or the all of the e-fuses of the memory 100 can correspond to other settings of the memory 100 different from the predetermined settings.

For example, as shown in FIG. 3, the part or the all of the e-fuses of the memory 100 are 29 predetermined e-fuses, wherein the 29 predetermined e-fuses includes 2 predetermined e-fuses of the e-fuse unit G11, 4 predetermined e-fuses of the e-fuse unit G12, 10 predetermined e-fuses of the e-fuse unit G13, 3 predetermined e-fuses of the e-fuse unit G21, 5 predetermined e-fuses of the e-fuse unit G22, and 5 predetermined e-fuses of the e-fuse unit G31. In addition, a number of predetermined e-fuses included in each e-fuse unit of the e-fuse units G11-G31 is not greater than a number of all e-fuses included in the each e-fuse unit. Generally, the tester 102 needs to provide certain current to each predetermined e-fuse of the 29 predetermined e-fuses to blow the each predetermined e-fuse, so a maximum of e-fuses blown by the tester 102 each time is determined by maximum current provided by the tester 102 and current consumption of blowing the each predetermined e-fuse (wherein the each predetermined e-fuse is called each blown e-fuse hereafter). For example, suppose that the maximum current provided by the tester 102 is 60 mA, and the current consumption corresponding to the each blown e-fuse is 6 mA. Then, the maximum of e-fuses blown by the tester 102 each time is 10. That is, the tester 102 can blow at most 10 e-fuses of the memory 100 each time. However, as shown in FIG. 3, if the tester 102 only blows predetermined e-fuses included in one e-fuse unit of the e-fuse units G11-G31 each time, an e-fuse blowing ability (determined by the maximum current provided by the tester 102 and the current consumption corresponding to the each blown e-fuse) of the tester 102 may not be fully utilized. For example, when the tester 102 only needs to blow the 2 predetermined e-fuses of the e-fuse unit G11, the tester 102 only needs to provide 12 mA current to blow the 2 predetermined e-fuses of the e-fuse unit G11. That is, meanwhile, the e-fuse blowing ability corresponding to 48 mA current will not be utilized.

Figure 4:
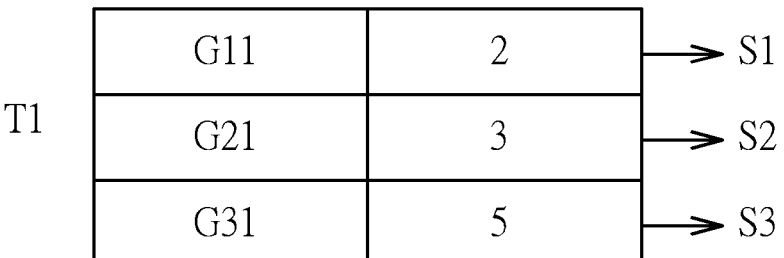
FIG. 4 is a diagram illustrating the tester blowing the predetermined e-fuses according to a blowing sequence.
Figure 4:
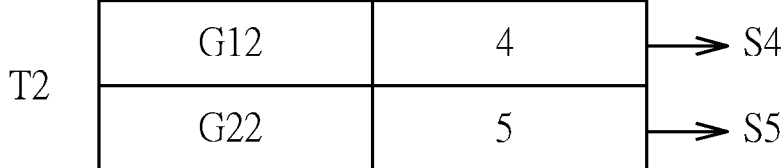
Figure 4:

Please refer to FIG. 4. FIG. 4 is a diagram illustrating the tester 102 blowing the 29 predetermined e-fuses according to a blowing sequence determined by the tester 102. As shown in FIG. 4, in the blowing sequence, the tester 102 blows the 2 predetermined e-fuses of the e-fuse unit G11, the 3 predetermined e-fuses of the e-fuse unit G21, and the 5 predetermined e-fuses of the e-fuse unit G31 at a time T1, blows the 4 predetermined e-fuses of the e-fuse unit G12 and the 5 predetermined e-fuses of the e-fuse unit G22 at a time T2 after the time T1, and blows the 10 predetermined e-fuses of the e-fuse unit G13 at a time T3 after the time T2. However, the present invention is not limited to the blowing sequence shown in FIG. 4. That is, the tester 102 can determine other blowing sequences to blow the 29 predetermined e-fuses.

According to the blowing sequence shown in FIG. 4, at the time T1, the tester 102 can generate blown signal sets S1-S3 according to the 2 predetermined e-fuses of the e-fuse unit G11, the 3 predetermined e-fuses of the e-fuse unit G21, and the 5 predetermined e-fuses of the e-fuse unit G31, respectively, wherein the blown signal sets S1-S3 correspond to 10 e-fuses, which is equal to the maximum (that is, 10) of the e-fuses blown by the tester 102 each time. Therefore, the e-fuse blowing ability of the tester 102 can be fully utilized at the time T1. After the blown signal sets S1-S3 are generated, the tester 102 can transmit the blown signal sets S1-S3 to the receiving circuit 104. In one embodiment of the present invention, the tester 102 transmits the blown signal sets S1-S3 to the receiving circuit 104 through corresponding input/output pads of the memory 100. In addition, each blown signal set of the blown signal sets S1-S3 includes a code to make the each blown signal set correspond to a corresponding e-fuse group of the e-fuse groups G1-G3. Therefore, after the receiving circuit 104 receives the blown signal sets S1-S3, the receiving circuit 104 can utilize a decoding circuit to decode the code included in the each blown signal set and transmit the each blown signal set to a corresponding register group of the register groups R1-R3 according to the code included in the each blown signal set. Then, the corresponding register group can transmit the each blown signal set to the corresponding e-fuse group through a corresponding bus group of the bus groups B1-B3 according to the code included in the each blown signal set. For example, because the blown signal set S1 corresponds to the 2 predetermined e-fuses of the e-fuse unit G11 and the e-fuse unit G11 is included in the e-fuse group G1, the receiving circuit 104 can utilize the decoding circuit to decode a code included in the blown signal set S1 and transmit the blown signal set S1 to the register group R1 according to the code included in the blown signal set S1. Then, the register group R1 can transmit the blown signal set S1 to the e-fuse group G1 through the bus group B1 according to the code included in the blown signal set S1. Similarly, the receiving circuit 104 can transmit the blown signal sets S2, S3 to the register groups R2, R3 according to codes included in the blown signal sets S2, S3 respectively, the register group R2 can transmit the blown signal set S2 to the e-fuse group G2 through the bus group B2 according to the code included in the blown signal sets S2, and the register group R3 can transmit the blown signal set S3 to the e-fuse group G3 through the bus group B3 according to the code included in the blown signal sets S3. In addition, in another embodiment of the present invention, the receiving circuit 104 includes a plurality of decoding circuits, and the receiving circuit 104 utilizes a corresponding decoding circuit of the plurality of decoding circuits to decode the code included in the each blown signal set to make the each blown signal set be transmitted to the corresponding e-fuse group.

After the blown signal sets S1-S3 are transmitted to the e-fuse groups G1-G3 respectively, the tester 102 can provide 12 mA current to the e-fuse group G1 according to the blown signal set S1, resulting in the 2 predetermined e-fuses of the e-fuse unit G11 being blown by the 12 mA current, wherein operation of the tester 102 blowing the 2 predetermined e-fuses of the e-fuse unit G11 is well-known to those of ordinary skill in the art, so further description thereof is omitted for simplicity. In addition, the tester 102 can provide 18 mA current to the e-fuse group G2 to blow the 3 predetermined e-fuses of the e-fuse unit G21 and provide 30 mA current to the e-fuse group G3 to blow the 5 predetermined e-fuses of the e-fuse unit G31. Therefore, the tester 102 needs to provide 60 mA current to the e-fuse groups G1-G3, wherein the 60 mA current is equal to the maximum current provided by the tester 102, and the e-fuse blowing ability of the tester 102 is fully utilized.

Similarly, at the time T2, the tester 102 can generate blown signal sets S4, S5 according to the 4 predetermined e-fuses of the e-fuse unit G12 and the 5 predetermined e-fuses of the e-fuse unit G22, respectively, wherein the blown signal sets S4, S5 correspond to 9 e-fuses which is less than the maximum (that is, 10) of the e-fuses blown by the tester 102 each time. In addition, because the blown signal sets S4, S5 correspond to the 9 e-fuses, 90% of the e-fuse blowing ability of the tester 102 is utilized. After the blown signal sets S4, S5 are generated, the tester 102 can transmit the blown signal sets S4, S5 to the receiving circuit 104, the receiving circuit 104 can transmit each blown signal set of the blown signal sets S4, S5 to a corresponding register group of the register groups R1, R2, and the corresponding register group can transmit the each blown signal set to a corresponding e-fuse group of the e-fuse groups G1, G2 through a corresponding bus group of the bus groups B1, B2, wherein operation of transmitting the each blown signal set of the blown signal sets S4, S5 to the corresponding e-fuse group is similar to above-mentioned operation corresponding to the blown signal sets S1, S2, so further description thereof is omitted for simplicity. After the blown signal sets S4, S5 are transmitted to the e-fuse groups G1, G2 respectively, the tester 102 can blow the 4 predetermined e-fuses of the e-fuse unit G12 and the 5 predetermined e-fuses of the e-fuse unit G22 according to the blown signal sets S4, S5, respectively. In addition, because the tester 102 only generates the blown signal sets S4, S5 at the time T2, the register group R3, the bus group B3, and the e-fuse group G3 are not utilized at the time T2.

Similarly, at the time T3, the tester 102 can generate a blown signal set S6 according to the 10 predetermined e-fuses of the e-fuse unit G13. After the blown signal set S6 is generated, the tester 102 can transmit the blown signal set S6 to the receiving circuit 104, the receiving circuit 104 can transmit the blown signal set S6 to the register group R1, and the register group R1 can transmit the blown signal set S6 to the e-fuse group G1 through the bus group B1, wherein operation of transmitting the blown signal set S6 to the e-fuse group G1 is similar to above-mentioned operation corresponding to the blown signal set S1, so further description thereof is omitted for simplicity. After the blown signal set S6 is transmitted to the e-fuse group G1, the tester 102 can blow the 10 predetermined e-fuses of the e-fuse unit G13 according to the blown signal set S6. In addition, because the tester 102 only generates the blown signal set S6 at the time T3, the register groups R2-R3, the bus groups B2-B3, and the e-fuse groups G2-G3 are not utilized at the time T3.

Therefore, because the memory 100 includes the register groups R1-R3, the bus groups B1-B3, and the e-fuse groups G1-G3, the tester 102 can blow the 29 predetermined e-fuses according to the blowing sequence shown in FIG. 4. By blowing the 29 predetermined e-fuses according to the blowing sequence shown in FIG. 4, the utilization of the e-fuse blowing ability of the tester 102 can be increased, a time consuming of blowing the 29 predetermined e-fuses can also be reduced, and an efficiency of blowing the predetermined e-fuses can also be improved.

In addition, one of ordinary skill in the art should clearly realize functions of the tester 102 and the receiving circuit 104 through the above-mentioned corresponding descriptions of the tester 102 and the receiving circuit 104, so one of ordinary skill in the art can easily implement the tester 102 and the receiving circuit 104 through field programmable gate arrays (FPGAs) with the above-mentioned functions of the tester 102 and the receiving circuit 104 respectively, or application-specific integrated circuits (ASICs) with the above-mentioned functions of the tester 102 and the receiving circuit 104 respectively, or software modules with the above-mentioned functions of the tester 102 and the receiving circuit 104 respectively, or an analog integrated circuits with the above-mentioned functions of the tester 102 and the receiving circuit 104 respectively. Moreover, because one of ordinary skill in the art can input codes of the above mentioned functions of the tester 102 and the receiving circuit 104 to the FPGAs, or utilize intellectual property cores (IPs) of the above mentioned functions of the tester 102 and the receiving circuit 104 to implement the ASICs, and the FPGAs and the IPs are obviously ready-made to one of ordinary skill in the art, further descriptions of corresponding structures of the tester 102 and the receiving circuit 104 are omitted for simplicity.

To sum up, the present invention provides the memory with e-fuses and the tester applied to the memory. The tester determines a blowing sequence for blowing a part or all of the e-fuses of the memory to adjust the predetermined settings of the memory. Then, the tester generates corresponding blown signal sets according to the blowing sequence each time, and transmits the corresponding blown signal sets to the receiving circuit. The receiving circuit transmits each blown signal set of the corresponding blown signal sets to a corresponding e-fuse group through a corresponding bus group to blow predetermined e-fuses of the corresponding e-fuse group. Therefore, compared to the prior art, the present invention can increase the utilization of the e-fuse blowing ability of the tester, reduce the time consuming of blowing the part or the all of the e-fuses of the memory, and increase the efficiency of blowing the part or the all of the e-fuses of the memory.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A memory with electrically programmable fuses (e-fuses) comprising:
   a receiving circuit; and
   a plurality of e-fuse groups, wherein each of the plurality of e-fuse groups is coupled to the receiving circuit through a corresponding bus group;
   wherein the receiving circuit receives a plurality of blown signal sets generated by a tester after the tester finishes testing the memory and transmits each of the plurality of blown signal sets to an e-fuse group of the memory, predetermined e-fuses of the e-fuse group are blown according to the each of the plurality of blown signal sets to adjust predetermined settings of the memory, and the each of the plurality of blown signal sets only corresponds to the e-fuse group;
   wherein a number of the plurality of blown signal sets is not greater than a number of the e-fuse groups.

2. The memory of claim 1, wherein the receiving circuit comprises:
   a plurality of register groups, wherein a register group of the register groups transmits the each of the plurality of blown signal sets to the e-fuse group.

3. The memory of claim 1, wherein the receiving circuit comprises:
   a decoding circuit, wherein the decoding circuit decodes a code comprised in the each of the plurality of blown signal sets to make the each of the plurality of blown signal sets be transmitted to the e-fuse group.

4. The memory of claim 1, wherein the receiving circuit comprises:
   a plurality of decoding circuits, wherein a corresponding decoding circuit of the decoding circuits decodes a code comprised in the each of the plurality of blown signal sets to make the each of the plurality of blown signal sets be transmitted to the e-fuse group.

5. The memory of claim 1, wherein the tester generates the plurality of blown signal sets according to a test result.

6. The memory of claim 5, wherein when the blown signal sets are transmitted to partial e-fuse groups of the e-fuse groups, a number of the partial e-fuse groups is not greater than the number of the e-fuse groups, a number of blown e-fuses of the partial e-fuse groups is not greater than a maximum, the maximum is determined by the tester, and the blown e-fuses correspond to the blown signal sets.

7. The memory of claim 6, wherein the maximum is determined by maximum current provided by the tester and current consumption corresponding to an e-fuse of the blown e-fuses.

8. The memory of claim 5, wherein the receiving circuit receives the blown signal sets from the tester through corresponding input/output pads of the memory.

9. The memory of claim 1, wherein the predetermined settings correspond to at least one of activations of partial memory cells of the memory, internal operation voltages of the memory, and operational timings of the memory.

10. The memory of claim 1, wherein a number of the predetermined e-fuses of the e-fuse group is not greater than a number of all e-fuses of the e-fuse group.

11. A memory with e-fuses comprising:
   a plurality of e-fuse groups, wherein each of partial e-fuse groups of the plurality of e-fuse groups receives a corresponding blown signal set to blow predetermined e-fuses of the each of the partial e-fuse groups to adjust predetermined settings of the memory, a number of the partial e-fuse groups is not greater than a number of the e-fuse groups.

12. The memory of claim 11, wherein a plurality of blown signal sets received by the e-fuse groups are generated from a tester.

13. The memory of claim 12, wherein a number of blown e-fuses of the partial e-fuse groups is not greater than a maximum, the maximum is determined by the tester, and the blown e-fuses correspond to the blown signal sets.

14. The memory of claim 13, wherein the maximum is determined by maximum current provided by the tester and current consumption corresponding to an e-fuse of the blown e-fuses.

15. The memory of claim 11, wherein the predetermined settings correspond to at least one of activations of partial memory cells of the memory, internal operation voltages of the memory, and operational timings of the memory.

16. The memory of claim 11, wherein a number of the predetermined e-fuses of the each of the partial e-fuse groups is not greater than a number of all e-fuses of the each of the partial e-fuse groups.

17. A tester applied to a memory with e-fuses, wherein the memory comprises L e-fuse groups, the tester generating a plurality of blown signal sets to the memory after the tester finishes testing the memory, wherein each blown signal set of the plurality of blown signal sets has a code which makes the each blown signal set be transmitted to a corresponding e-fuse group of the L e-fuse groups, predetermined e-fuses of the corresponding e-fuse group are blown according to the each blown signal set to adjust predetermined settings of the memory, L is an integer greater than 1, a number of the at least one blown signal set is not greater than L, and the tester generates the plurality of blown signal sets according to a test result.

\*    \*    \*    \*    \*